(12) United States Patent
Huang et al.

(10) Patent No.: US 12,424,557 B2
(45) Date of Patent: Sep. 23, 2025

(54) DUAL STRUCTURED BURIED RAIL

(71) Applicant: INTERNATIONAL BUSINESS MACHINES CORPORATION, Armonk, NY (US)

(72) Inventors: Huai Huang, Clifton Park, NY (US); Nicholas Anthony Lanzillo, Wynantskill, NY (US); Ruilong Xie, Niskayuna, NY (US); Hosadurga Shobha, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 501 days.

(21) Appl. No.: 17/930,123

(22) Filed: Sep. 7, 2022

(65) Prior Publication Data

US 2024/0079333 A1    Mar. 7, 2024

(51) Int. Cl.
*H01L 23/535* (2006.01)
*H01L 21/74* (2006.01)
*H01L 21/768* (2006.01)
*H01L 23/48* (2006.01)

(52) U.S. Cl.
CPC .......... *H01L 23/535* (2013.01); *H01L 21/743* (2013.01); *H01L 21/76898* (2013.01); *H01L 23/481* (2013.01)

(58) Field of Classification Search
CPC .................. H01L 23/535; H01L 21/743; H01L 21/76898; H01L 23/481; H01L 23/5286
See application file for complete search history.

(56) References Cited

U.S. PATENT DOCUMENTS

| | | |
|---|---|---|
| 6,492,244 B1 | 12/2002 | Christensen |
| 10,475,692 B2 | 11/2019 | Licausi |
| 10,636,739 B2 | 4/2020 | Beyne |
| 10,700,207 B2 | 6/2020 | Chen |
| 2011/0062502 A1* | 3/2011 | Yin ........................ H01L 23/485 |
| | | 257/E21.409 |
| 2018/0294267 A1* | 10/2018 | Licausi ................. H01L 21/743 |
| 2020/0105671 A1 | 4/2020 | Lai |

(Continued)

OTHER PUBLICATIONS

Jones Scotten. "Imec Buried Power Rail and Backside Power Delivery at VLSI", TechInsights, Jun. 28, 2022, 5 pages.

*Primary Examiner* — Patricia D Valenzuela
(74) *Attorney, Agent, or Firm* — Matthew Zehrer

(57) ABSTRACT

A dual structure buried rail includes an upper rail and a lower rail. The upper rail may be inset relative to the lower rail. In other words, the lower rail may be wider than the upper rail, and/or the lower rail may have a larger geometrical volume than the upper rail. The upper rail may be located at a boundary of, and/or directly next to, an active device region and the lower rail may extend directly underneath at least a portion of the active device region. The lower rail may extend the entire length of the upper rail. The dual structure buried rail may reduce buried rail resistance which may reduce voltage drop thereacross and provide for improved semiconductor device and/or active device region performance. The dual structure buried rail may provide power potential delivery, provide potential sinking, or the like, to one or more active device region(s).

20 Claims, 14 Drawing Sheets

(56) References Cited

U.S. PATENT DOCUMENTS

2020/0266169 A1  8/2020  Kang
2021/0296234 A1  9/2021  Dechene
2021/0343646 A1  11/2021 Chen

* cited by examiner

DUAL STRUCTURED BURIED RAIL

BACKGROUND

The present disclosure relates generally to the field of semiconductor device technology and more particularly to a dual structured (e.g., dual layer, dual part, dual portion, or the like) buried rail.

SUMMARY

In an embodiment of the present disclosure, a semiconductor device is presented. The semiconductor device includes a pair of adjacent active device regions and a dual structured buried rail. The dual structured buried rail includes an upper rail and a lower rail. The upper rail is located in between the pair of adjacent active device regions and is inset with respect to the lower rail. The lower rail is in direct contact with the upper rail and has a greater volume with respect to the upper rail.

In another embodiment of the present disclosure, another semiconductor device is presented. The semiconductor device includes a pair of adjacent active device regions and a dual structured buried rail. The dual structured buried rail includes an upper rail and a lower rail. The upper rail in located between the pair of adjacent active device regions and inset with respect to the lower rail. The lower rail includes a curved lower surface and a horizontal upper surface that is in direct contact with the upper rail. The lower rail further has a greater volume with respect to the upper rail.

In another embodiment of the present disclosure, a semiconductor device fabrication method is presented. The method includes forming an upper rail of a dual structured buried rail within a substrate from a frontside. The method includes forming a bottom rail trench within the substrate from a backside. The bottom rail trench exposes at least a bottom surface of the upper rail. The method further includes forming a bottom rail within the bottom rail trench and upon the exposed bottom surface of the upper rail.

The above and other aspects, features, and advantages of various embodiments of the present disclosure will be more apparent from the following description taken in conjunction with the accompanying drawings.

BRIEF DESCRIPTION OF THE DRAWINGS

The above and other aspects, features, and advantages of various embodiments of the present disclosure will be more apparent from the following description taken in conjunction with the accompanying drawings.

DETAILED DESCRIPTION

Figure 1:
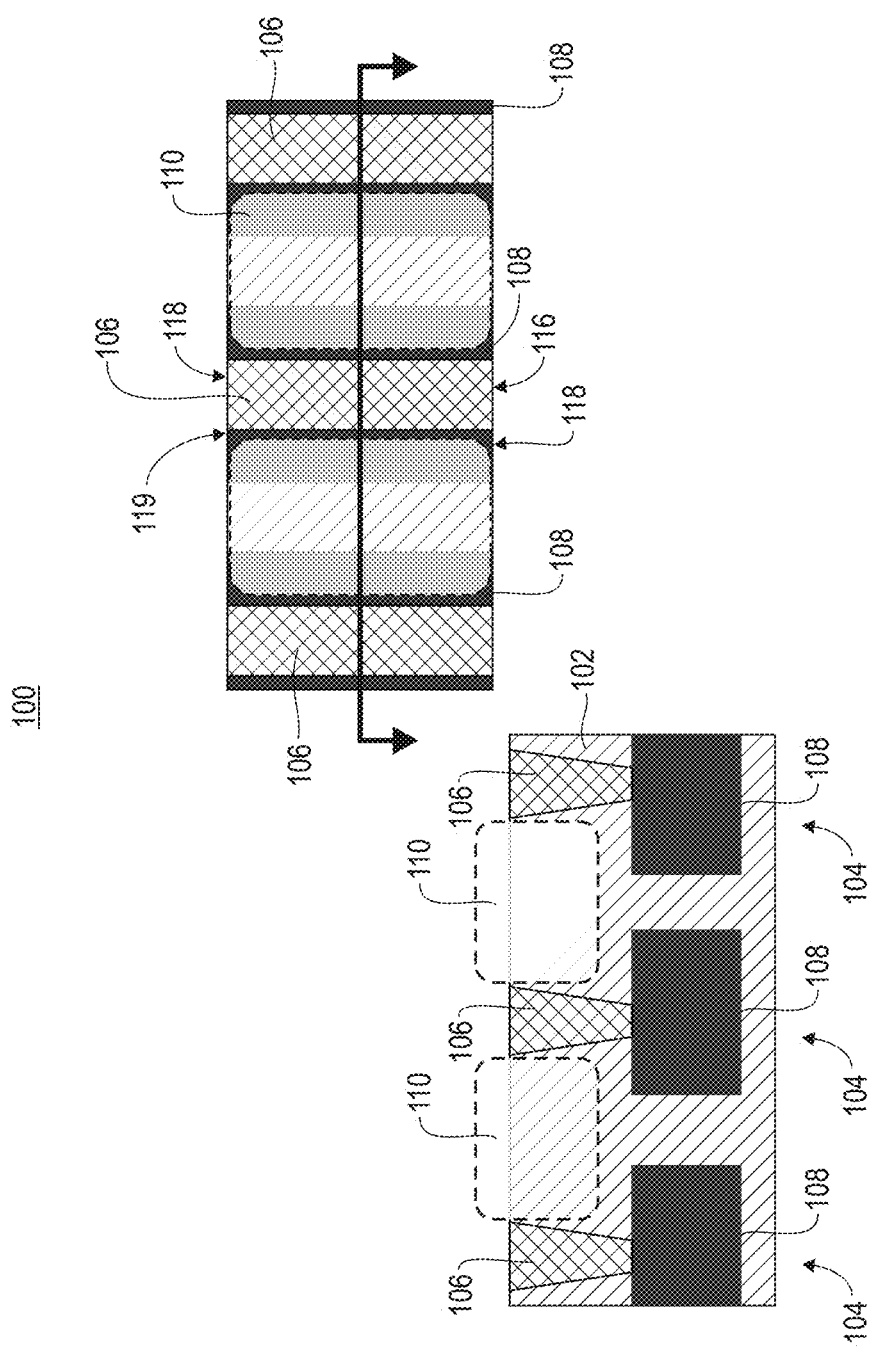
FIG. 1 depicts multiple views of a semiconductor device that includes a dual structure buried rail, in accordance with an embodiment of the present disclosure.

Embodiments of the present disclosure recognize that in modern electronic systems, a semiconductor device includes an active device region in which multiple devices, such as diodes, transistors, or the like are located. These devices within the active device region may receive potential (e.g., power, ground, etc.) from an associated, neighboring, and/or adjacent buried rail. Buried rails are typically located at a boundary of an active device region and are generally not located directly under active device regions. This results in unutilized or underutilized regions below active device regions and adjacent to buried rails.

Embodiments of the present disclosure therefore provide a dual structure buried rail. The dual structure buried rail includes an upper rail and a lower rail. The upper rail may be inset relative to the lower rail. In other words, the lower rail may be wider than the upper rail, the lower rail may have a larger geometrical volume than the upper rail, or the like. The upper rail may be located at a boundary of, and/or directly next to, an active device region and the lower rail may extend directly underneath at least a portion of the active device region. For example, the upper rail may be located between neighboring and adjacent active device regions and opposing portions of the lower rail may be respectively underneath both the neighboring and adjacent active device regions. The lower rail may extend the entire length of the upper rail. For example, respective end surfaces of the upper rail and lower rail may be coplanar.

Embodiments of the present disclosure provide for reduced buried rail resistance which may reduce voltage drop thereacross and provide for improved semiconductor device and/or active device region performance. The dual structure buried rail may provide power potential delivery, provide potential sinking, or the like, to one or more active device region(s). That is, a single dual structure buried rail may provide power potential, ground potential, etc. to one or more active device regions.

Embodiments of the present disclosure recognize that the lower rail may serve as a landing pad for an associated backside interconnect structure, such as a vertical interconnect access (VIA). Like the upper rail, the interconnect structure may be inset relative to the lower rail. The interconnect structure may be fabricated by forming a trench that exposes a portion of the lower rail and subsequently filling the trench with conductive material(s). Since the interconnect structure may be inset relative to the lower rail, the width of the associated trench may be narrower than the width the lower rail and the lower rail may therefore limit or reduce over etching of the trench therearound.

Embodiments of the present disclosure provide a method of forming a semiconductor device that includes the dual structure buried rail. The method may include forming one or more upper buried rail structures from a frontside of the semiconductor device. The method may include forming one or more lower buried rail trenches from the backside of the semiconductor device. The method may include forming a lower rail within the one or more lower buried rail trenches from the backside of the semiconductor device. The method may include partially recessing the lower rail(s) and forming a dielectric upon the partially recessed lower rail(s) from the backside of the semiconductor device. The method may include forming one or more backside interconnect trenches within the dielectric that exposes or lands upon a lower rail, respectively. The method may include forming an interconnect within the backside interconnect trench upon the lower rail.

Embodiments of the present disclosure provide a method of forming a semiconductor device that includes the dual structure buried rail. The method may include forming one or more frontside upper buried rail trenches from a frontside of the semiconductor device. Respective bottoms of the one or more upper buried rail trenches may be located within a buried oxide layer of a buried oxide (BOX) substrate. The method may further include subsequently forming one or more frontside lower rail mushroom trenches from a frontside of the semiconductor device from the respective bottoms of the one or more upper buried rail trenches within the buried oxide layer. The method may further include forming one or more dual structure buried rails by filling the one or more frontside upper buried rail trenches and the one or more frontside lower rail mushroom trenches. The method may include forming one or more backside interconnect trenches that exposes or lands upon respective portion(s) of the lower rail, respectively. The method may include forming an interconnect within the backside interconnect trench upon the lower rail.

Referring now to the FIGS., wherein like components are labeled with like numerals, exemplary embodiments that involve a semiconductor carrier, semiconductor device, such as a wafer, chip, integrated circuit, microdevice, etc. in accordance with embodiments of the present disclosure are shown and will now be described in greater detail below. It should be noted that while this description may refer to components in the singular tense, more than one component may be depicted throughout the FIGS. The specific number of components depicted in the FIGS. and the orientation of the structural FIGS. was chosen to best illustrate the various embodiments described herein.

FIG. 1 depicts multiple views of a semiconductor device 100 that includes a dual structure buried rail 104, in accordance with an embodiment of the present disclosure. More specifically, FIG. 1 depicts a top-down view and cross-sectional view of semiconductor device 100.

Dual structure buried rail 104 includes an upper rail 106 and a lower rail 108, both of which are electrically conductive. Upper rail 106 is above and in mechanical and electrical contact with lower rail 108. In some embodiments, upper rail 106 is fabricated first from a first metal or other electrically conductive material and lower rail 108 is fabricated subsequently from the same or different electrically conductive material.

Upper rail 106 may be inset relative to the lower rail 108. In other words, the top surface of lower rail 108 may be wider than the bottom surface of upper rail 106. Lower rail 108 may have a larger geometrical volume than upper rail 106. Upper rail 106 may be located at a boundary of, and/or directly next to, one or more active device region(s) 110. Lower rail 108 may extend directly vertically underneath at least a portion of the one or more active device region(s) 110. For example, a portion, section, etc. of the lower rail 108 may be directly underneath, below, inside, etc. a perimeter footprint of active device regions 110.

Lower rail 108 may extend the entire length of upper rail 106. For example, end surface 116 of upper rail 106 and end surface 118 of lower rail 108 may be coplanar, end surface 117 of upper rail 106 and end surface 119 of lower rail 108 may be coplanar. Dual structure buried rail 104 may provide power potential delivery, provide potential sinking, or the like, to one or more active device region(s) 110. That is, a single dual structure buried rail 104 may provide power potential, ground potential, etc. to one or more active device regions 110.

Upper rail 106 and lower rail 108 may be formed within a substrate 102, or one or more regions of the substrate 102, respectively. For example, upper rail 106 may be formed within a shallow trench isolation (STI) region of substrate 102 and lower rail 108 may be formed within a buried substrate region. STI region may be located generally between active device regions 110 and the buried substrate region may be located below active device regions 110 and below the STI portion.

STI fabrication techniques may be utilized to form STI regions within substrate 102. For example, STI region may be formed by depositing a STI dielectric material, such as a high-k dielectric material, within STI trenches formed within substrate 102 or depositing an STI dielectric material layer upon a top surface of substrate 102. The STI dielectric material may be a different material relative to substrate 102.

The area of semiconductor device 100 between neighboring STI regions may form active device regions 110. As such, respective STI regions may define the side boundaries of respective active device regions 110. In some implementations, a lower boundary active device region 110 may be the top surface of substrate 102, may be below the top surface of substrate 102, may be between the top surface of upper rail 106 and the top surface of lower rail 108, or the like. In some implementations, STI dielectric material, or other dielectric barrier material(s), may be located between the sidewall(s) of upper rail 106 and active device region 110.

Multiple microdevices, such as diodes, transistors, or the like, (not shown) may be located within active device region 110. For example, semiconductor fabrication techniques may be utilized for form diodes, fin field effect transistors (finFETs), nanosheet FETs, nanowire FETs, storage cells, or the like, upon the top surface of substrate 102. These microdevices within the active device region 110 may receive potential (e.g., power, ground, etc.) from an associated, neighboring, and/or adjacent dual structure buried rail 104. For example, multiple finFETs, nanosheet FETs, storage cells, or the like, may be electrically connected to upper rail 106. For clarity, though upper rail 106 is defined as being over, above, or upon lower rail 108, upper rail 106 is generally below microdevices formed within active device region 110 and, therefore, dual structured buried rail 104 is considered buried or beneath such microdevices. In some implementations, an upper boundary of active device region 110 may be the top surface of a topmost microdevice located therein and respective side boundaries of active device region 110 may be left and right most side surfaces of the outermost microdevices located therein.

In some implementations, the area of semiconductor device 100 between neighboring upper rails 106 may form active device regions 110. As such, upper rails 106 may define the side boundaries of respective active device regions 110. In some implementations, adequate substrate 102 material may be between the sidewall(s) of upper rail 106, the top surface of lower rail 108, and the microdevices within device region 110, to prevent electrical shorting between such microdevices and dual structured buried rail 104.

With the addition of lower rail 108, the cross-sectional area of dual structured buried rail 104 is relatively larger than that of upper rail 106. As such, dual structured buried rail 104 may provide for relatively reduced buried rail resistance, which may reduce voltage drop thereacross, and provide for improved semiconductor device 100 performance and/or microdevice performance within active device region 110. Further, since lower rail 108 may be formed directly under or below at least a portion of active device region 110, a region which has been traditionally unutilized or underutilized, such performance benefits may be achieved without other inadequate semiconductor device 100 design or performance tradeoffs.

In an implementation, as depicted semiconductor device 100 may include a pair of active device regions 110. One dual structured buried rail 104 may be located between the pair of active device regions 110 and may supply a first potential (e.g., power potential, or the like) to the pair of active device regions 110. Respective outside dual structured buried rails 104 may be located on the respective other or distal side of a respective active device region 110 and may supply a second potential (e.g., ground potential, or the like) to a respective active device region 110 of the pair of active device regions 110.

FIGS. 2-7 depict fabrication stages of forming semiconductor device 100. Specifically, the method discussed with respect to FIGS. 2-7 relates to the semiconductor device 100 depicted in FIG. 1, where dual structured buried rail 104 is formed to include an upper rail 106 between active device regions 110 and to further include lower rail 108 that is located below or under at least a portion of active device region 110.

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched, and the second element can act as an etch stop.

The terms "about," "substantially," "approximately," and variations thereof, are intended to include the degree of error associated with measurement of the quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are a semiconductor microdevice commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

Figure 2:
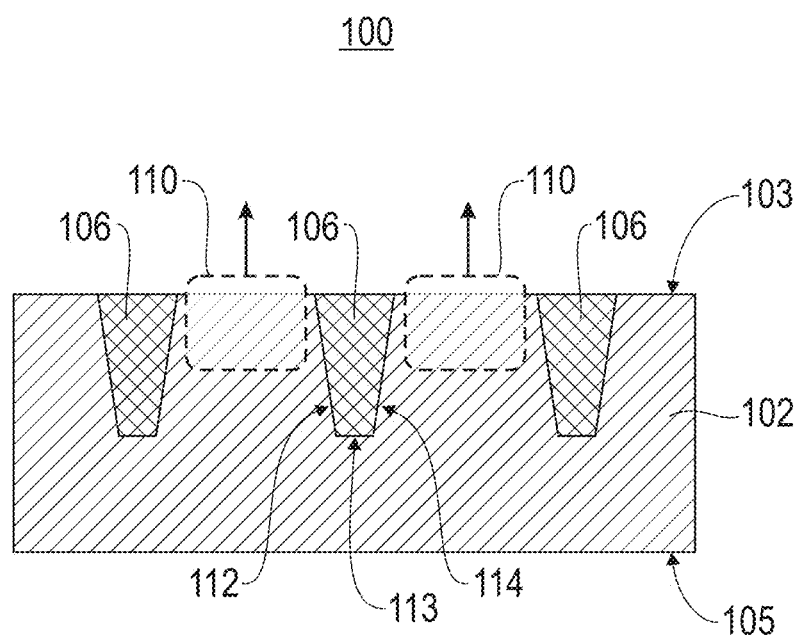
FIG. 2 though FIG. 7 are cross-sectional fabrication views of a semiconductor device that that includes a dual structure buried rail, in accordance with embodiments of the present disclosure.

FIG. 2 depicts a cross-sectional fabrication view of semiconductor device 100, in accordance with embodiments of the present disclosure. At the present stage of fabrication, semiconductor device 100 includes substrate 102, one or more upper rails 106, and one or more active device regions 110.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk substrate. The substrate includes a frontside 103 and a backside 105. Frontside 103 and backside 105 may be generally opposite facing surfaces of semiconductor device 100.

In one embodiment, utilizing patterning, lithography, etching, etc. techniques, microdevices or structures thereof may be formed upon the top surface of substrate 102. For example, finFET fins may be formed upon the top surface of substrate 102, from substrate 102 by removing portions of substrate 102, or the like, within active device region 110. In this manner, semiconductor device 100 is depicted with upward vertical arrows from the top surface of substrate 102 and from one or more active device regions 110. As such, it is to be understood that at, prior to, and/or after fabrication of one or more upper rails 106, microdevices, or components thereof, may be formed within active regions 110.

In one implementation, finFET fins can be patterned by conventional patterning techniques, such as Self-Aligned Double Patterning (SADP), Self-Aligned Quadruple Patterning (SAQP), etc. within active device regions 110. As the finFET fins may be formed from subtracting material(s) from substrate 102, the fins may retain the material properties (e.g., dopants, or the like) therefrom. In another implementation, utilizing deposition techniques, the finFET fins may be formed upon substrate 102 within active device regions 110. The finFET fins could be positively formed upon substrate 102 by deposition techniques such PVD, CVD, ALD, Epitaxial growth, or the like. In this embodiment, the finFET fins may be doped, to form the appropriate dopant type of the transistor(s) located within active device region 110.

STI region(s), an STI layer, or the like, (not shown) which may be collectively referred herein as STI, may be formed by depositing STI material(s), such as silicon nitride (SiN), Silicon Dioxide (SiO$_2$), a combination of SiN and Silicon Dioxide (SiO$_2$), or the like, upon the substrate 102 and upon and between the finFET fins or other microdevice structure(s). The STI may, at least partially, electrically isolate neighboring active device regions 110, electrically isolate transistor or other microdevice components within neighboring active device regions 110, or the like.

One or more upper rails 106 may be formed by forming one or more upper rail trenches from frontside 103 and depositing electrically conductive material within the one or more upper rail trenches from frontside 103. In a particular implementation, the one or more upper rail trenches may be formed by first removing portions of STI and/or portions of substrate 102 from the frontside 103 stopping at a particular predetermined depth (e.g., lower surface of ILD, or the like). The undesired portions of these applicable material(s) may be removed removal techniques such as e.g., depositing and patterning a mask, lithography, etching, and/or the like. Etching techniques may be chosen that result in sloped sidewalls 112, 114 whereby a width of bottom surface 113 is smaller than a width of top surface 115, that result in vertical sidewalls 112, 114 whereby a width of bottom surface 113 is substantially the same as the width of top surface 115.

One or more upper rails 106 may be further formed by depositing electrically conductive material upon the STI and/or portions of substrate 102 from the frontside 103 filling one or more upper rail trenches. The one or more upper rails 106 material may be any generally conductive material that is used as an electrode, such as, for example, Tungsten, Cobalt, Copper, Ruthenium, Rhodium, Platinum, Titanium Nitride, Tantunum Nitride, Titanium Aluminum Nitride, alloys thereof, or the like.

In some implementations, one or more upper rails 106 includes an internal conductive region and a conductive barrier layer(s) (not shown) lining sidewalls and bottom surfaces of the internal conductive region. The conductive barrier layer(s) may be formed of Titanium, Titanium Nitride, Tantalum, Tantalum Nitride, Cobalt, a combination thereof, or the like. The internal conductive region may be formed of metals such as Copper, Ruthenium, Rhodium, Tungsten, Cobalt, Tungsten, Platinum, Titanium Nitride, Tantunum Nitride, Titanium Aluminum Nitride, alloys thereof, or the like.

Figure 3:
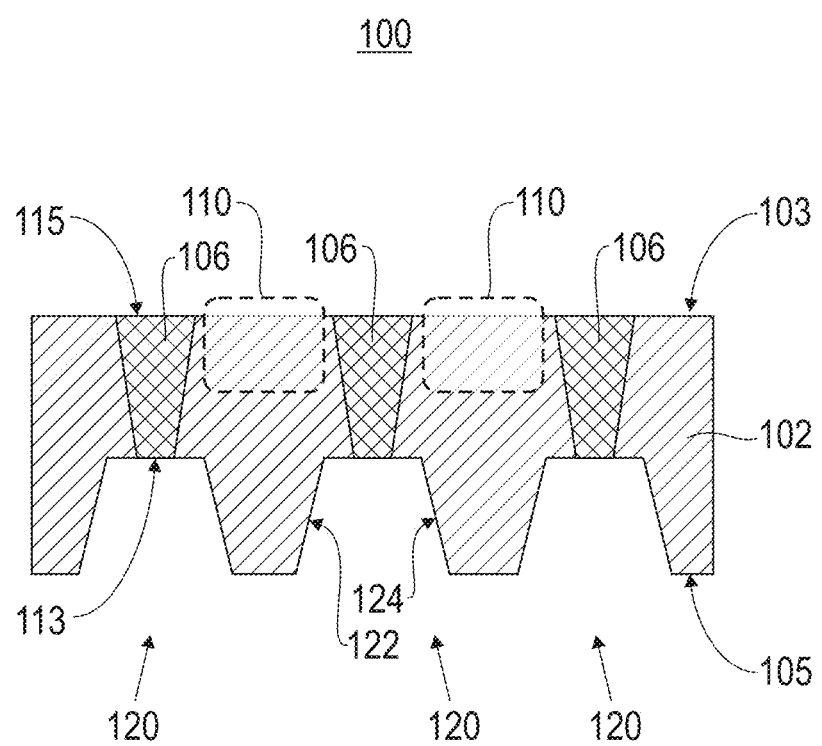

FIG. 3 depicts a cross-sectional fabrication view of semiconductor device 100, in accordance with embodiments of the present disclosure. In the depicted fabrication stage, one or more bottom rail trenches 120 are formed from backside 105. Each of the one or more bottom rail trenches 120 may expose at least the entire bottom surface of one associated top rail 106. The one or more bottom rail trenches 120 may further expose a lower portion of the side surface(s) of the one associated top rail 106.

The one or more bottom rail trenches 120 may be formed by first removing portions of substrate 102 and/or STI stopping at the bottom surface of top rail(s) 106. The undesired portions of these applicable material(s) may be removed removal techniques such as e.g., depositing and patterning a mask upon backside 105, lithography, etching, or the like. The one or more bottom rail trenches 120 may be further formed by subsequently removing portions of substrate 102, such that one or more bottom rail trenches 120 are formed to the depth and width to expose at least the entire bottom surface 113 of the associated top rail 106. For example, the width bottom rail trench 120 is larger than width of bottom surface 113 of the associated top rail 106. Etching techniques may be chosen that result in sloped sidewalls 122, 124 whereby a width of the top of bottom rail trench 120 is smaller than a width of the bottom of bottom rail trench 120, that result in vertical sidewalls 122, 124, or the like.

It is to be understood that surface of sidewall 112 and surface of sidewall 122 may be oppositely sloped. For example, surface of sidewall 112 may have a negative slope and surface of sidewall 122 may have a positive slope. Similarly, surface 114 and surface of sidewall 124 may be oppositely sloped. For example, surface 114 may have a positive slope and surface of sidewall 124 may have a negative slope. In other words, upper rail 306 may have downward tapering sidewalls 112, 114 such that the bottom surface of upper rail 306 is narrower than the top surface of upper rail 306. Similarly, lower rail 308 may have upwardly tapering sidewalls 122, 124 such that the top surface of lower rail 308 is narrower than the bottom surface of lower rail 308.

Figure 4:
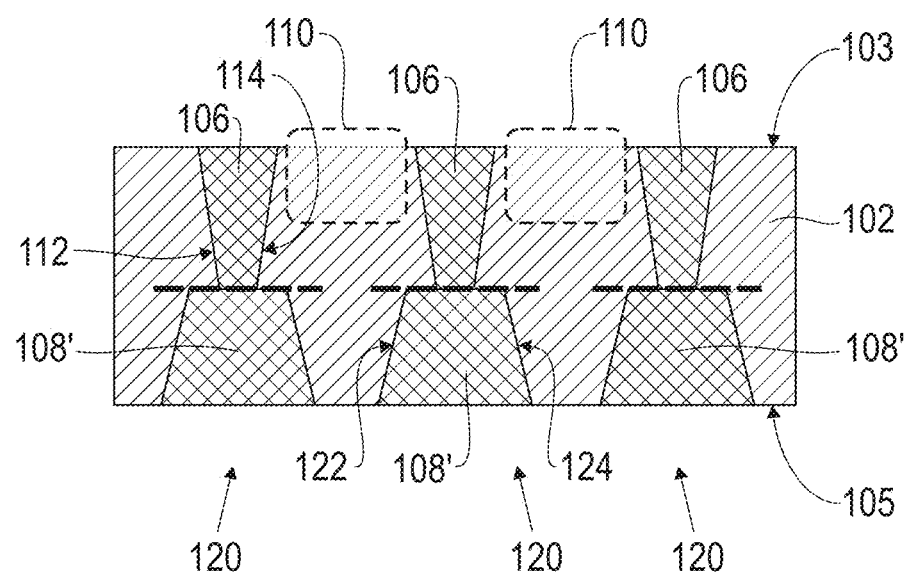

FIG. 4 depicts a cross-sectional fabrication view of semiconductor device 100, in accordance with embodiments of the present disclosure. In the depicted fabrication stage, bottom rail 108' is formed in an associated bottom rail trench 120. At the present fabrication stage, prior to recessing the one or more bottom rail(s) 108' to form respective bottom rail(s) 108, the one or more bottom rail(s) 108' may be coplanar with backside 105.

One or more bottom rails 108' may be further formed by depositing electrically conductive material upon the STI and/or portions of substrate 102 from the backside 105, filling the one or more bottom rail trenches 120. The one or more bottom rails 108' may be formed of a generally conductive material that is used as an electrode, such as, for example, Tungsten, Platinum, Copper, Ruthenium, Cobal, Aluminum, Titanium Nitride, Tantunum Nitride, Titanium Aluminum Nitride, alloys thereof, or the like.

In some implementations, one or more bottom rails 108' include an internal conductive region and a conductive barrier layer(s) (not shown) lining sidewalls and upper surfaces of the internal conductive region. The conductive barrier layer(s) may be formed of Titanium, Titanium Nitride, Tantalum, Tantalum Nitride, Cobalt, a combination thereof, or the like. The internal conductive region may be formed of metals such as Copper, Aluminum, Tungsten, Cobalt, Tungsten, Platinum, Titanium Nitride, Tantunum Nitride, Titanium Aluminum Nitride, alloys thereof, or the like.

Figure 5:
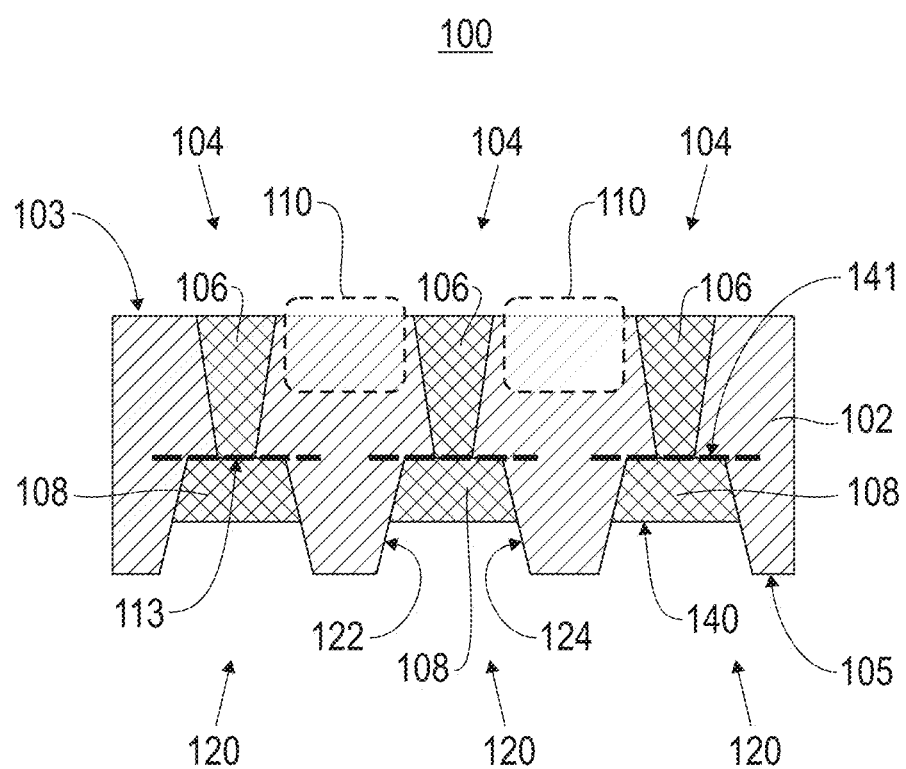

FIG. 5 depicts a cross-sectional fabrication view of semiconductor device 100, in accordance with embodiments of the present disclosure. At the present fabrication stage, one or more bottom rail(s) 108' are partially recessed above and from the backside 105 to form respective bottom rail(s) 108.

One or more bottom rails 108 may be formed by partially recessing one or more bottom rail(s) 108' from backside 105 stopping at a particular predetermined depth. The partial recessing of one or more bottom rail(s) 108' may be accomplished by removal techniques such as etching, or the like. The etch or partial removal may partially expose sidewalls 122, 124, may partially reform bottom rail trench 120, may form bottom surface 140 of bottom rail 108, and may form top surface 141 of bottom rail 108. Due to the partial recessing of one or more bottom rail(s) 108' to form one or more bottom rails 108, the bottom surface 140 of bottom rail may be above backside 105.

Due to the width of bottom surface 113 of top rail 106 being smaller than the width of top surface of 141 of lower rail 108 may be formed such that at least a portion of lower rail 108 is directly under or below at least a portion of active device region 110. Since the region directly below active device region 110 has been traditionally unutilized or underutilized, performance benefits (e.g., reduced buried rail resistance, reduced voltage drop across buried rail, improved semiconductor device 100 and/or active device region 100 performance therefrom, etc.) may be achieved without inadequate semiconductor device 100 design or performance tradeoffs.

Figure 6:
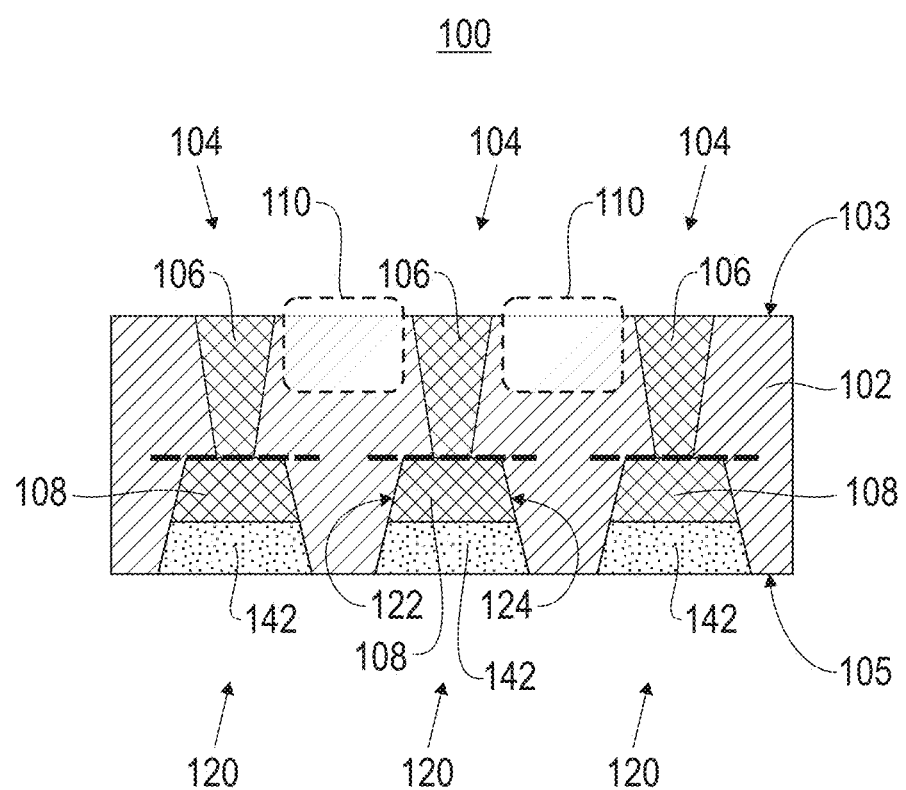

FIG. 6 depicts a cross-sectional fabrication view of semiconductor device 100, in accordance with embodiments of the present disclosure. In the present fabrication stage, dielectric fill 142 may be formed upon the bottom surface 140 of lower rail 108 within the reformed bottom rail trench 120 from backside 105.

Dielectric fill 142 may be formed by forming a blanket dielectric layer extending into the reformed bottom rail trench 120 upon the bottom surface 140 of lower rail 108 and upon backside 105 and performing a planarization process, such as a chemical mechanical polish (CMP), or a mechanical grinding process, to remove excess portions of the blanket dielectric layer. The planarization process may result in a bottom surface 143 of the dielectric fill 142 being coplanar with backside 105. As such, a portion of the dielectric fill layer may be retained upon the bottom surface 140 of lower rail 108 within the reformed bottom rail trench 120. This retained portion of the dielectric fill layer may form the one or more dielectric fill 142 regions below the one or more lower rails 108.

Figure 7:
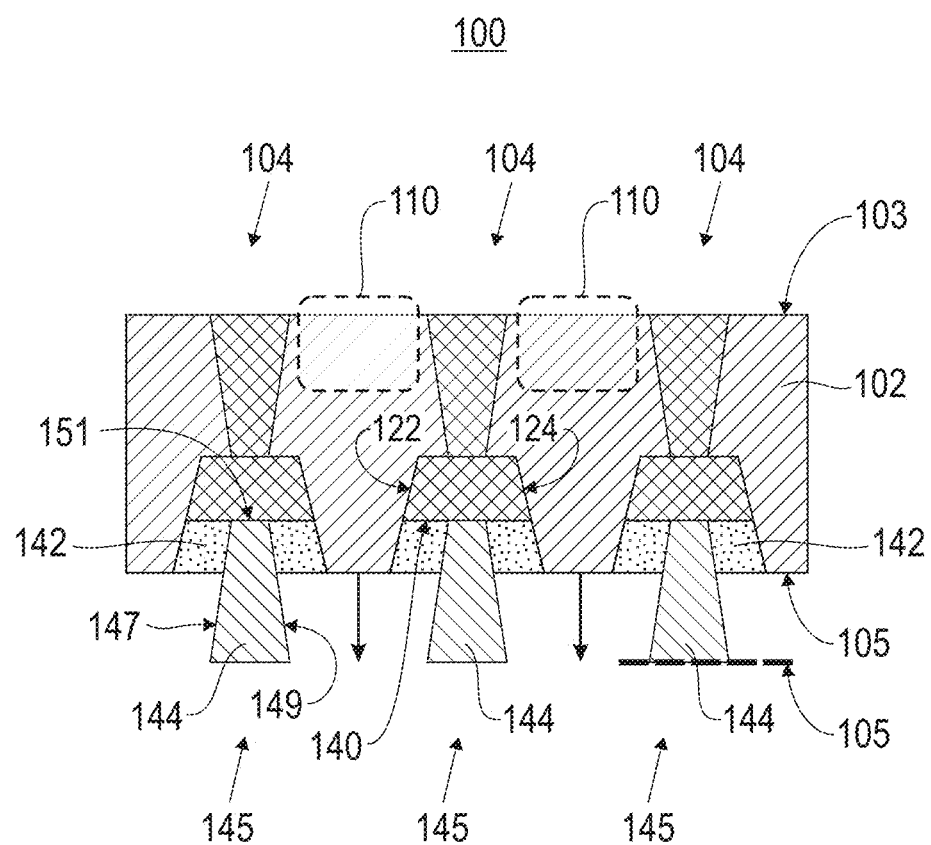

FIG. 7 depicts a cross-sectional fabrication view of semiconductor device 100, in accordance with embodiments of the present disclosure. In the present fabrication stage, semiconductor device may undergo further backside 105 operations and one or more backside connection vertical interconnect accesses (VIAs) 144 may be formed.

In the depicted fabrication stage, semiconductor device 100 is shown with downward vertical arrows from backside 105. As such, it is to be understood that at, prior to, and/or after fabrication of one or more backside connection VIAs 144, other backside 105 layers may be fabricated, other backside 105 features, devices, or components, may be fabricated, or the like.

The one or more backside connection VIAs 144 may be formed by forming one or more backside connection VIA trenches 145 from backside 105. Each of the one or more backside connection VIA trenches 145 may expose at least a portion of bottom surface 140 of the associated lower rail 108. In this manner, lower rail 108 may serve as a landing pad for an associated backside connection VIA 144. In these implementations, the width of bottom surface 140 of the associated lower rail 108 may be greater that a width of the top of the one or more backside connection VIAs 144. In other words, the backside connection VIA 144 and associated backside connection VIA trench 145 may be inset with respect to the associated lower rail 108 there above. Since the one or more backside connection VIA trenches 145 may be inset relative to the associated lower rail 108, over etching of material(s) to form the backside connection VIA trench 145 is limited. As such, the propensity of etching away material(s) located around or immediately adjacent to the associated lower rail 108 is reduced.

The one or more backside connection VIA trenches 145 may be formed by removing portions of dielectric fill 142 and/or portions of substrate 102 from backside 105 stopping at the bottom surface of bottom rail(s) 108. The undesired portions of these applicable material(s) may be removed removal techniques such as e.g., depositing and patterning a mask upon backside 105, lithography, etching, or the like. Etching techniques may be chosen that result in sloped sidewalls 147, 149 whereby a width of top surface 151 is smaller than a width of bottom surface 152 of backside connection VIA 144, that result in vertical sidewalls 147, 149 whereby a width of top surface 151 is substantially the same as the width of bottom surface 152 of backside connection VIA 144, or the like.

It is to be understood that surface of sidewall 122 and surface of sidewall 147 may have the same slope orientation and that surface of sidewall 124 and surface 149 may have the same slop orientation. For example, surface of sidewall 122 and surface of sidewall 147 may have a positive slope and surface of sidewall 124 and surface of sidewall 149 may have a negative slope. In other words, backside connection VIA 144 may have upwardly tapering sidewalls 147, 149 similar to sidewalls 122, 124 of lower rail 308.

The one or more backside connection VIAs 144 may be further formed by depositing electrically conductive material upon dielectric fill 142, upon portions of substrate 102, and/or upon the partially exposed surface 140 of lower rail 108 from the backside 105, filling the one or more backside connection VIA trenches 145. The one or more backside connection VIAs 144 may be formed of a generally conductive material that is used as an electrode, such as, for example, Tungsten, Platinum, Titanium Nitride, Tantunum Nitride, Titanium Aluminum Nitride, alloys thereof, or the like.

In some implementations, the one or more backside connection VIAs 144 include an internal conductive region and a conductive barrier layer(s) (not shown) lining sidewalls and upper surfaces of the internal conductive region. The conductive barrier layer(s) may be formed of Titanium, Titanium Nitride, Tantalum, Tantalum Nitride, Cobalt, a combination thereof, or the like. The internal conductive region may be formed of metals such as Copper, Aluminum, Tungsten, Cobalt, Tungsten, Platinum, Titanium Nitride, Tantunum Nitride, Titanium Aluminum Nitride, alloys thereof, or the like.

Subsequently, a planarization process, such as a CMP, or a mechanical grinding process, may remove excess portions of the one or more backside connection VIAs 144. The planarization process may result in a respective bottom surface 152 of the one or more backside connection VIAs 144 being coplanar with backside 105. For example, if other backside 105 layers are fabricated and included within semiconductor device 100, bottom surface 152 of the one or more backside connection VIAs 144 may be coplanar with the bottom most surface of such other backside 105 layers. Alternatively, if additional backside 105 layers are not fabricated and not included within semiconductor device 100, bottom surface 152 of the one or more backside connection VIAs 144 may be coplanar with the bottom surface 143 of dielectric fill 142 and/or with backside 105 of substrate 102.

Figure 8:
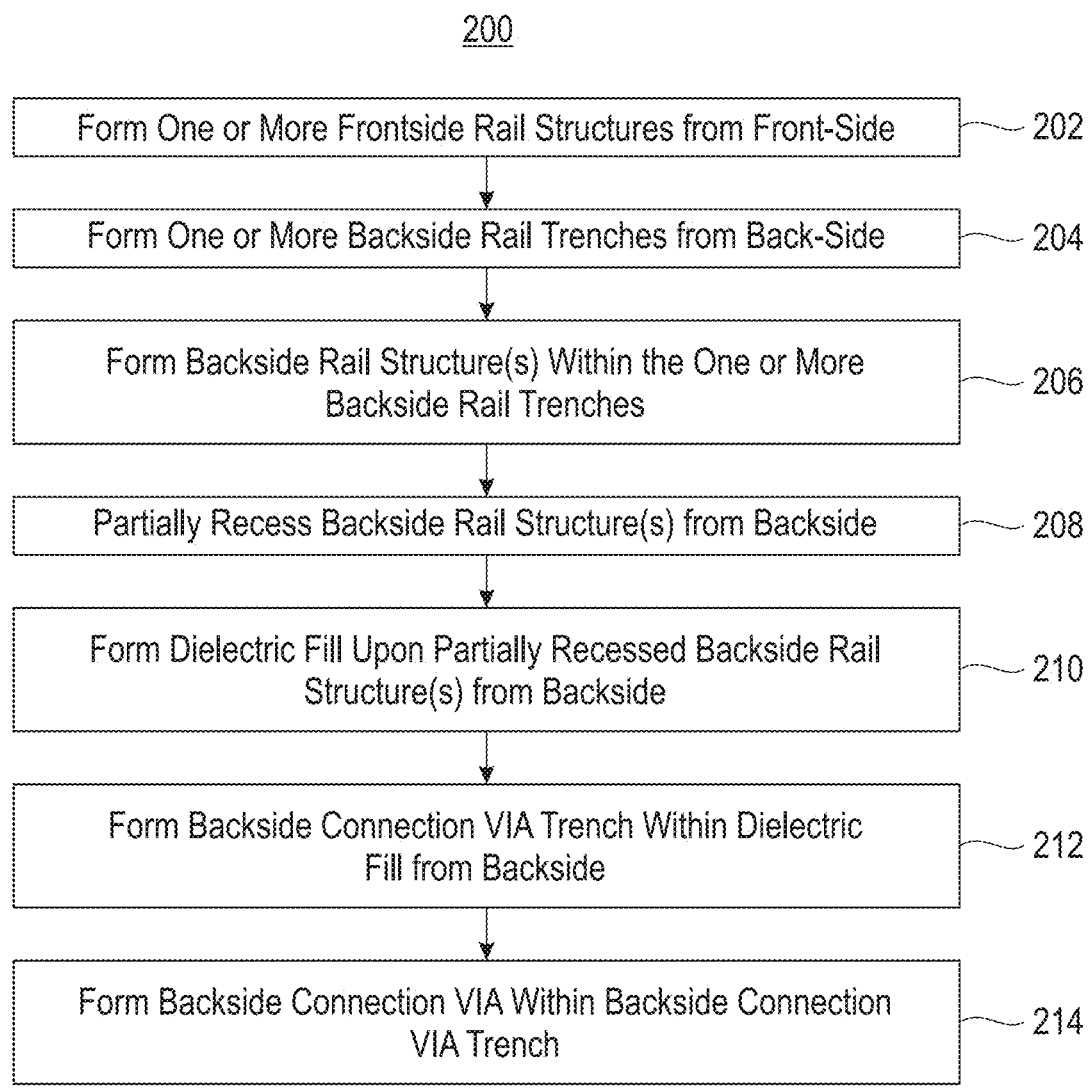
FIG. 8 depicts a method of fabricating a semiconductor device that includes a dual structure buried rail, in accordance with embodiments of the present disclosure.

FIG. 8 depicts method 200 of fabricating semiconductor device 100 that includes dual structure buried rail 104, in accordance with embodiments of the present disclosure. Method 200 may include forming one or more frontside buried rails 106 from frontside 103 (block 202) and may correspond with the fabrication stage and semiconductor device 100 structure depicted in FIG. 2.

Method 200 may include forming one or more backside buried rail trenches 120 (block 204) and one or more backside buried rails 108' from backside 105 (block 206) and may correspond with the fabrication stage and semiconductor device 100 structures depicted in FIG. 3 and in FIG. 4, respectively.

Method 200 may include forming one or more backside buried rails 108 from one or more backside buried rails 108' by partially recessing one or more backside buried rails 108' from backside 105 (block 208) and may correspond with the fabrication stage and semiconductor device 100 structure depicted in FIG. 5.

Method 200 may include forming a dielectric fill 142 upon the one or more backside buried rails 108 from backside 105 (block 210) and may correspond with the fabrication stage and semiconductor device 100 structure depicted in FIG. 6.

Method 200 may include forming one or more backside connection VIA trenches 145 (block 212) and one or more backside connection VIAs 144 from backside 105 (block 214) and may correspond with the fabrication stage and semiconductor device 100 structure depicted in FIG. 7, respectively.

Figure 9:
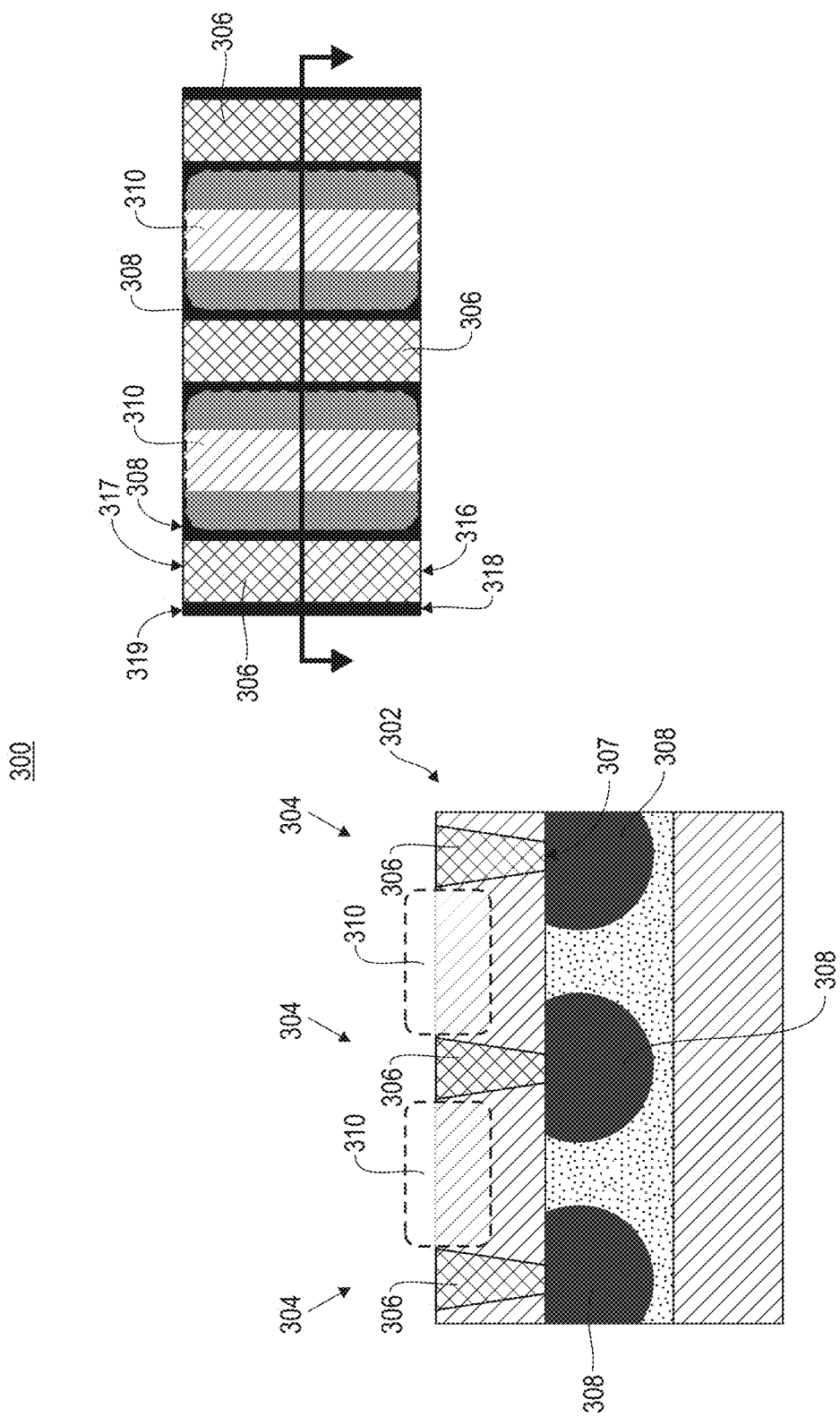
FIG. 9 depicts multiple views of a semiconductor device that includes a dual structure buried rail, in accordance with an embodiment of the present disclosure.

FIG. 9 depicts multiple views of semiconductor device 300 that includes a dual structure buried rail 304, in accordance with an embodiment of the present disclosure. More specifically, FIG. 9 depicts a top-down view and cross-sectional view of semiconductor device 300.

Dual structure buried rail 304 includes an upper rail 306 and a lower rail 308, both of which are electrically conductive. Upper rail 306 is above and in mechanical and electrical contact with lower rail 308. In some embodiments, upper rail 306 and lower rail 308 are simultaneously fabricated first from a first metal or other electrically conductive material from a frontside 304 of semiconductor device 300.

Upper rail 306 may be inset relative to the lower rail 308. In other words, a top surface 321 of lower rail 308 may be wider than the bottom surface 309 of upper rail 306. Lower rail 308 may have a larger geometrical volume than upper rail 306. Upper rail 306 may be located at a boundary of, and/or directly next to, one or more active device region(s) 310. Lower rail 308 may extend directly underneath at least a portion of the one or more active device region(s) 310. Lower rail 308 may extend the entire length of upper rail 306. For example, end surface 316 of upper rail 306 and end surface 318 of lower rail 308 may be coplanar, and end surface 317 of upper rail 306 and end surface 319 of lower rail 308 may be coplanar. Dual structure buried rail 304 may provide power potential delivery, provide potential sinking, or the like, to one or more active device region(s) 310. That is, a single dual structure buried rail 304 may provide power potential, ground potential, etc. to one or more active device regions 310.

Upper rail 306 and lower rail 308 may be formed within a substrate 302, or one or more regions of the substrate 302, respectively. For example, upper rail 306 may be formed within an upper semiconductor layer of substrate 302 and lower rail 308 may be formed within a buried oxide region of substrate 302. The buried oxide layer may be located below between the upper semiconductor layer of substrate 302 and a lower semiconductor layer of substrate 302.

The area of semiconductor device 300 between neighboring upper rails 308 may form active device regions 310. As such, upper rails 308 may define the side boundaries of respective active device regions 310. In some implementations, a lower boundary active device region 310 may be the top surface of substrate 302, may be below the top surface of substrate 302, may be the top surface of the buried oxide layer of substrate 302, may be between the top surface 307 of upper rail 306 and the top surface 321 of lower rail 308, or the like. In some implementations, substrate 302 material, STI dielectric material, or other dielectric barrier material(s), may be located between the sidewall(s) of upper rail 306 and active device region 110.

Multiple microdevices, such as diodes, transistors, or the like, (not shown) may be located within active device region 310. For example, semiconductor fabrication techniques may be utilized for form diodes, fin field effect transistors (finFETs), nanosheet FETs, nanowire FETs, storage cells, or the like, upon the top surface of substrate 302. These microdevices within the active device region 310 may receive potential (e.g., power, ground, etc.) from an associated, neighboring, and/or adjacent dual structure buried rail 304. For example, multiple finFETs, nanosheet FETs, storage cells, or the like, may be electrically connected to upper rail 306. For clarity, though upper rail 306 is defined as being over, above, or upon lower rail 308, upper rail 306 is generally below microdevices formed within active device region 310 and, therefore, dual structured buried rail 304 is considered buried or beneath such microdevices. In some implementations, an upper boundary of active device region 310 may be the top surface of a topmost microdevice located therein and respective side boundaries of active device region 310 may be left and right most side surfaces of the outermost microdevices located therein.

With the addition of lower rail 308, the cross-sectional area of dual structured buried rail 304 is relatively larger than that of upper rail 306. As such, dual structured buried rail 304 may provide for relatively reduced buried rail resistance, which may reduce voltage drop thereacross, and provide for improved semiconductor device 300 performance and/or microdevice performance within active device region 310. Further, since lower rail 308 may be formed directly under or below at least a portion of active device region 310, a region which has been traditionally unutilized or underutilized, such performance benefits may be achieved without other inadequate semiconductor device 300 design or performance tradeoffs.

In an implementation, as depicted, semiconductor device 300 may include a pair of active device regions 310. One dual structured buried rail 304 may be located between the pair of active device regions 310 and may supply a first potential (e.g., power potential, or the like) to the pair of active device regions 310. Respective outside dual structured buried rails 304 may be located on the respective other or distal side of a respective active device region 310 and may supply a second potential (e.g., ground potential, or the like) to a respective active device region 310 of the pair of active device regions 310.

FIGS. 10-13 depict fabrication stages of forming semiconductor device 300. Specifically, the method discussed with respect to FIGS. 10-13 relates to the semiconductor device 300 depicted in FIG. 9, where dual structured buried rail 304 is formed to include an upper rail 306 between active device regions 310 and to further include lower rail 308 that is located vertically below or under at least a portion of active device region 310.

Figure 10:
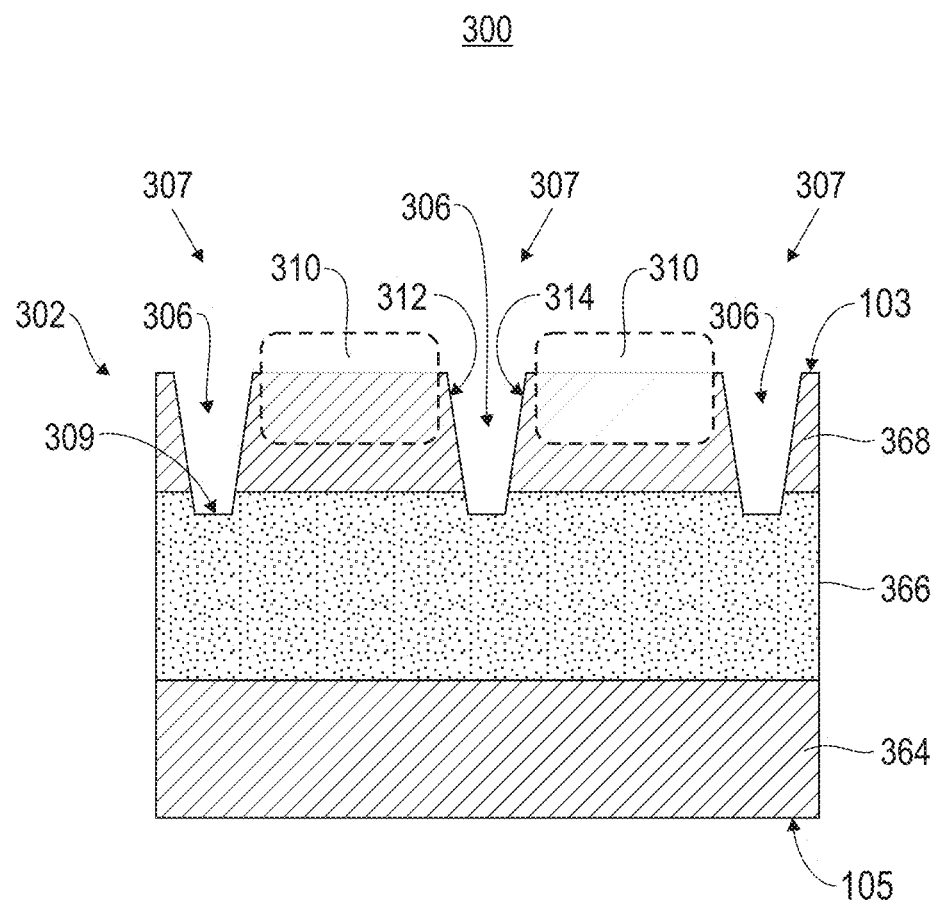
FIG. 10 though FIG. 13 are cross-sectional fabrication views of a semiconductor device that includes a dual structure buried rail, in accordance with embodiments of the present disclosure.

FIG. 10 depicts a cross-sectional fabrication view of semiconductor device 300, in accordance with embodiments of the present disclosure. At the present stage of fabrication, semiconductor device 300 includes substrate 302, one or more upper rail trenches 306', and one or more active device regions 310.

Non-limiting examples of suitable materials for the substrate 302 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

The substrate 302 can be a bulk substrate. Alternatively, and as depicted, substrate 302 may be a multilayered substrate, such as a silicon on insulator (SOI) substrate. The SOI substrate 302 may include a lower dielectric layer 364, a buried oxide layer 366, and an upper dielectric layer 368. The lower dielectric layer 364 and the upper dielectric layer 368 may be dielectric material(s) listed above. For example, the upper dielectric layer 368 may be a silicon layer. The buried oxide layer 366 may be an oxide of the material(s) listed above. The substrate 302 includes a frontside 303 and a backside 305. Frontside 303 and backside 305 may be generally opposite facing surfaces of semiconductor device 300.

In one embodiment, utilizing patterning, lithography, etching, etc. techniques, microdevices or structures thereof may be formed upon the top surface or frontside 303 of substrate 302. For example, finFET fins may be formed upon the frontside 303 of substrate 302, from substrate 302 by removing portions of substrate 302, or the like, within active device region 310. In this manner, semiconductor device 300 is depicted with upward vertical arrows from the one or more active device regions 310. As such, it is to be understood that at, prior to, and/or after fabrication of one or more upper rails 306, microdevices, or components thereof, may be formed within active regions 310.

In one implementation, finFET fins can be patterned by conventional patterning techniques, such as Self-Aligned Double Patterning (SADP), Self-Aligned Quadruple Patterning (SAQP), etc. within active device regions 310. As the finFET fins may be formed from subtracting material(s) from the upper dielectric layer 368 of substrate 302, the fins may retain the material properties (e.g., dopants, or the like) therefrom. In another implementation, utilizing deposition techniques, the finFET fins may be formed upon substrate 302 within active device regions 310. The finFET fins could be positively formed upon substrate 302 by deposition techniques such PVD, CVD, ALD, Epitaxial growth, or the like. In this embodiment, the finFET fins may be doped, to form the appropriate dopant type of the transistor(s) located within active device region 110.

STI region(s), an STI layer, or the like, (not shown) which may be collectively referred herein as STI, may be formed by depositing STI material(s), such as silicon nitride (SiN), Silicon Dioxide ($SiO_2$), a combination of SiN and Silicon Dioxide ($SiO_2$), or the like, upon the substrate 302 and upon and between the finFET fins or other microdevice structure(s). The STI may, at least partially, electrically isolate neighboring active device regions 310, electrically isolate transistor or other microdevice components within neighboring active device regions 310, or the like.

One or more upper rails 306 may be formed by initially forming one or more upper rail trenches 306' from frontside 303. In a particular implementation, the one or more upper rail trenches 306' may be formed by first removing portions of STI and/or portions of substrate 302 from the frontside 303 stopping at a particular predetermined depth (e.g., in between a top surface and bottom surface of the buried oxide layer 366, or the like). The undesired portions of these applicable material(s) may be removed removal techniques such as e.g., depositing and patterning a mask, lithography, etching, and/or the like. Etching techniques may be chosen that result in sloped sidewalls 312, 314 whereby a width of bottom surface 309 is smaller than a width 321 of upper rail trenches 306', that result in vertical sidewalls 312, 314 whereby a width of bottom surface 309 is substantially the same as the width 321 of upper rail trenches 306'.

Figure 11:
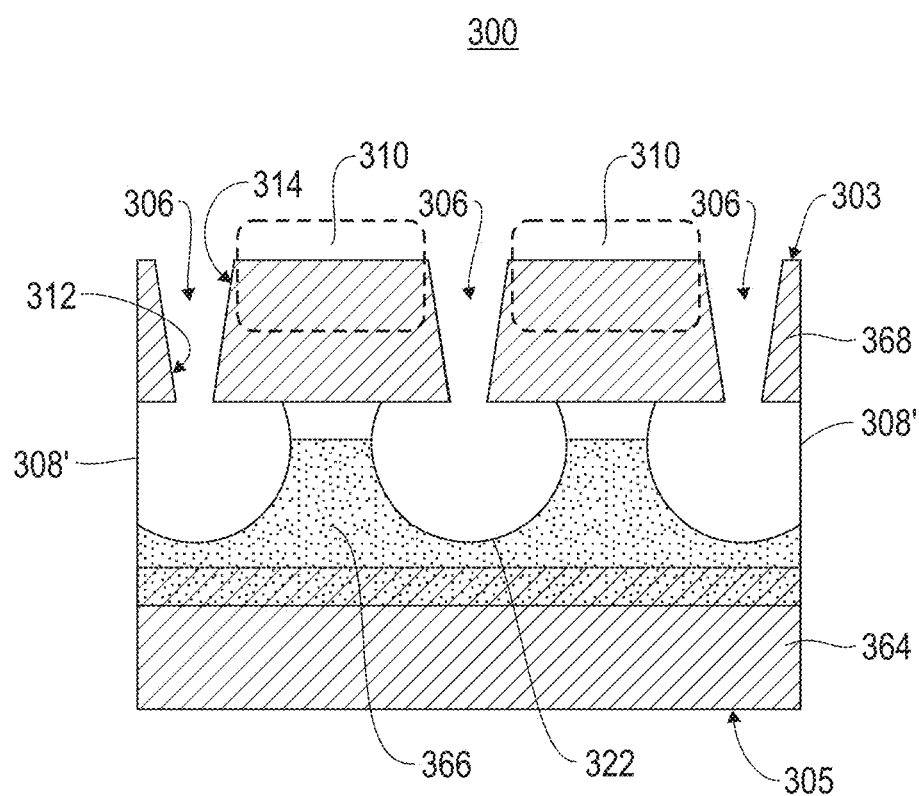

FIG. 11 depicts a cross-sectional fabrication view of semiconductor device 300, in accordance with embodiments of the present disclosure. At the present stage of fabrication, one or more dual structure trenches 370 are formed from frontside 303 by forming a lower rail trench 308' from the and extending below the upper rail trench 306'. Dual structure trench 370 generally includes the upper rail trench 306' and the lower rail trench 308'.

In the depicted fabrication stage, one or more lower rail trenches 308' are formed from, and extend below, the upper rail trench 306' from frontside 303. In some implementations, a second and subsequent etching process to that which formed upper rail trench 306' may enlarge the upper rail trench 306' within the buried oxide layer 366 of substrate 302, thereby forming the one or more lower rail trenches 308'. A top portion of the one or more lower rail trenches 308' is generally wider than a bottom portion of the associated upper rail trench 306'. In this manner, upper rail trench 306' is inset relative to the associated lower rail trench 308'. The width of lower rail trench 308' may be selected such that at least a portion of the lower rail trench 308' is vertically below at least a portion of one or more active device regions 310. A portion of the upper dielectric layer 368 of substrate 302 may form an upper boundary of lower rail trench 308'.

Etching techniques may be chosen that result in a radial, arced, or curved surface 322 that effectively forms the side and/or lower boundary of lower rail trench 308' and that may be located entirely within the buried oxide layer 366. The curved surface 322 may have a single radius, as depicted, or may have numerous radiuses such that curved surface 322 may be shaped as an ellipse, or the like.

Figure 12:
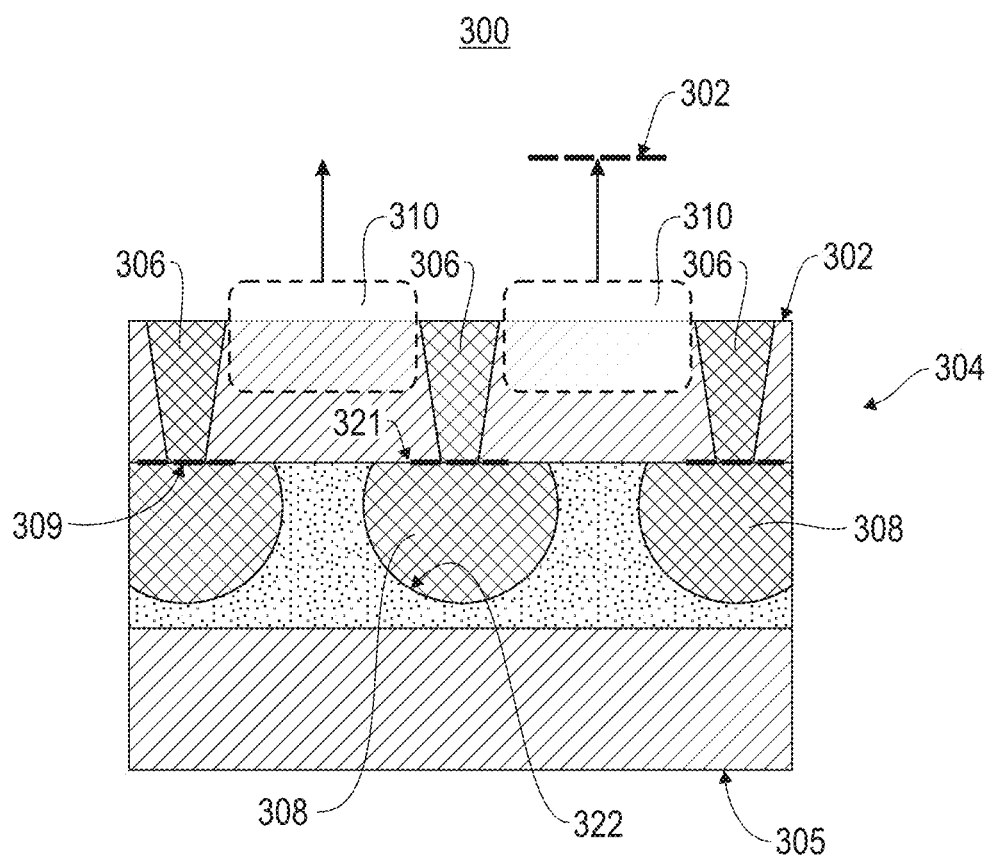

FIG. 12 depicts a cross-sectional fabrication view of semiconductor device 300, in accordance with embodiments of the present disclosure. At the present stage of fabrication, dual structure rail 304 is formed from frontside 303 within an associated dual structure trench 370. Dual structure rail 304 generally includes upper rail 306 and lower rail 308.

One or more dual structure rails 304 may be formed by depositing electrically conductive material(s) upon the buried oxide layer 366 and/or upper dielectric layer 368 sidewalls within dual structure trench 370. In one implementation, the electrically conductive material(s) may be deposited as a blanket layer within dual structure trenches 370 and upon the top surface of upper dielectric layer 368. Subsequently a CMP or polish may remove the electrically conductive material(s) from the top surface of upper dielectric layer 368 while the electrically conductive material(s) within dual structure trench 370 is retained. The one or more dual structure rail 304 material(s) may be any generally conductive material that is used as an electrode, such as, for example, Tungsten, Platinum, Titanium Nitride, Tantunum Nitride, Titanium Aluminum Nitride, alloys thereof, or the like.

In some implementations, the one or more dual structure rails 304 include an internal conductive region and a conductive barrier layer(s) (not shown) lining sidewalls and bottom surfaces of the internal conductive region. The conductive barrier layer(s) may be formed of Titanium, Titanium Nitride, Tantalum, Tantalum Nitride, Cobalt, a combination thereof, or the like. The internal conductive region may be formed of metals such as Copper, Aluminum, Tungsten, Cobalt, Tungsten, Platinum, Titanium Nitride, Tantunum Nitride, Titanium Aluminum Nitride, alloys thereof, or the like.

In one embodiment, utilizing patterning, lithography, etching, etc. techniques, microdevices or structures thereof may be formed upon the top surface of substrate 302. For example, finFET fins may be formed upon the top surface of upper dielectric layer 368 within active device regions 310. In this manner, semiconductor device 300 is depicted with upward vertical arrows from active device regions 310. As such, it is to be understood that at, prior to, and/or after fabrication of one or more dual structure rails 304, microdevices, or components thereof, may be formed within active regions 310.

Upper rail 306 may be inset relative to the lower rail 308. In other words, the top surface 321 of lower rail 308 may be wider than the bottom surface 309 of upper rail 306. Lower rail 308 may have a larger geometrical volume than upper rail 306. Upper rail 306 may be located at a boundary of, and/or directly next to, one or more active device region(s) 310. Lower rail 308 may extend vertically underneath at least a portion of the one or more active device region(s) 310. For example, a portion, section, etc. of the lower rail 308 may be directly underneath, below, inside, etc. a perimeter footprint of active device regions 310.

Dual structure buried rail 304 may provide power potential delivery, provide potential sinking, or the like, to one or more active device region(s) 310. That is, a single dual structure buried rail 304 may provide power potential, ground potential, etc. to one or more active device regions 310.

For clarity, at or after the present fabrication stage, one or more microdevices may be formed within active device regions 310. As such, the height or thickness of the substrate 302 and active device regions 310 may increase, as is depicted by the vertical arrows upward from active device regions 310.

Figure 13:
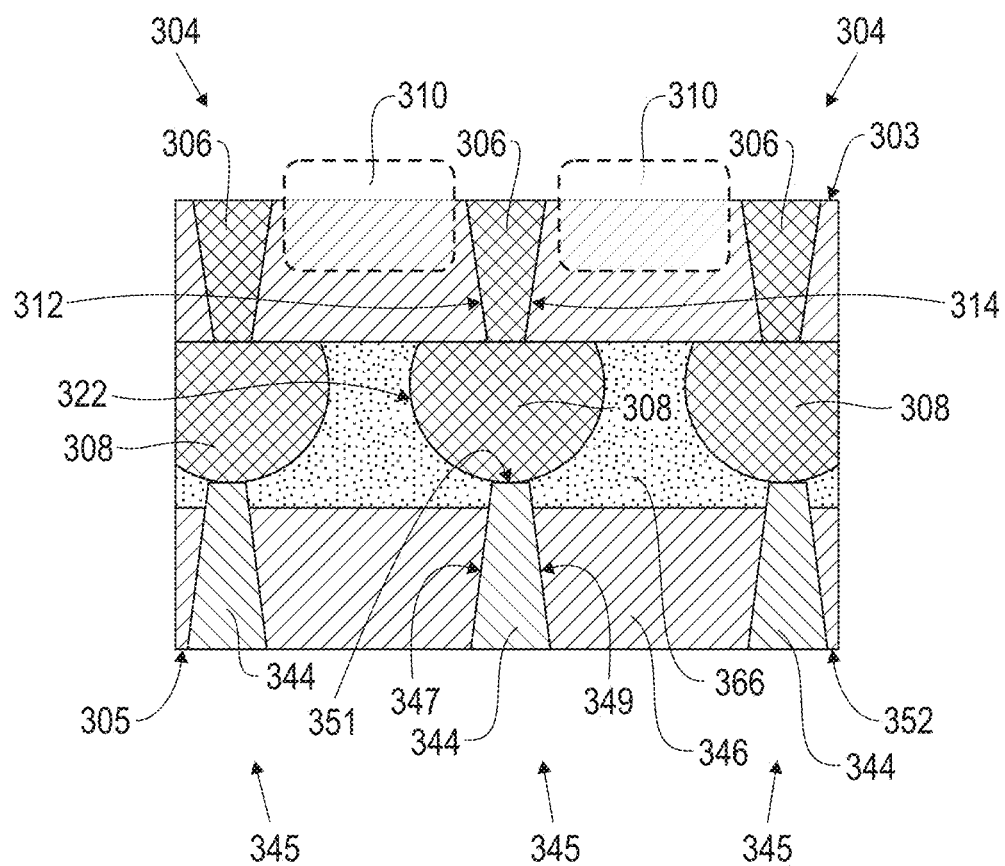

FIG. 13 depicts a cross-sectional fabrication view of semiconductor device 300, in accordance with embodiments of the present disclosure. In the present fabrication stage, semiconductor device may undergo further backside 305 operations and one or more backside connection vertical interconnect accesses (VIAs) 344 may be formed.

In the depicted fabrication stage, semiconductor device 300 is shown with downward vertical arrows from backside 305. As such, it is to be understood that at, prior to, and/or after fabrication of one or more backside connection VIAs 344, other backside 305 layers may be fabricated, other backside 305 features, devices, or components, may be fabricated, or the like.

The one or more backside connection VIAs 344 may be formed by forming one or more backside connection VIA trenches 345 from backside 305. Each of the one or more backside connection VIA trenches 345 may expose at least a portion of curved surface 322 of the associated lower rail 308. In this manner, lower rail 308 may serve as a landing pad for an associated backside connection VIA 344. In these implementations, the width or diameter of curved surface 322 of the associated lower rail 308 may be greater that a width of the top of the one or more backside connection VIAs 344. In other words, the backside connection VIA 344 and associated backside connection VIA trench 345 may be inset with respect to the associated lower rail 308 there above. Since the one or more backside connection VIA trenches 345 may be inset relative the associated lower rail 308, over etching of material(s), to form the backside connection VIA trench 345, is limited and the propensity of etching away material(s) around the associated lower rail 308 is reduced.

The one or more backside connection VIA trenches 345 may be formed by removing portions bottom dielectric layer 364 and/or portions of buried oxide layer 366 of substrate 302 from backside 305 stopping at the curved surface 322 of bottom rail(s) 308. The undesired portions of these applicable material(s) may be removed removal techniques such as e.g., depositing and patterning a mask upon backside 305, lithography, etching, or the like. Etching techniques may be chosen that result in sloped sidewalls 347, 349 whereby a width of top surface 151 is smaller than a width of bottom surface 352 of backside connection VIA 344, that result in vertical sidewalls 347, 349 whereby a width of top surface 351 is substantially the same as the width of bottom surface 352 of backside connection VIA 344, or the like. In other words, backside connection VIA 344 may have upwardly tapering sidewalls 347, 349 opposite to sidewalls 312, 314 of upper rail 306.

It is to be understood that surface 312 and surface 347 and that surface 314 and surface 349 may have opposite slope orientations, respectively. For example, surface 312 and surface 349 may have a negative slope and surface 347 and surface 314 may have a positive slope.

The one or more backside connection VIAs 344 may be further formed by depositing electrically conductive material upon dielectric layer 364 and/or portions of buried oxide layer 366 and lower rail 308 from the backside 305, filling the one or more backside connection VIA trenches 345. The one or more backside connection VIAs 344 may be formed of a generally conductive material that is used as an electrode, such as, for example, Tungsten, Platinum, Titanium Nitride, Tantunum Nitride, Titanium Aluminum Nitride, alloys thereof, or the like.

In some implementations, the one or more backside connection VIAs 344 include an internal conductive region and a conductive barrier layer(s) (not shown) lining sidewalls and upper surfaces of the internal conductive region.

Subsequently, a planarization process, such as a CMP, or a mechanical grinding process, may remove excess portions of the one or more backside connection VIAs 344. The planarization process may result in a respective bottom surface 352 of the one or more backside connection VIAs 344 being coplanar with backside 305. For example, if other backside 305 layers are fabricated and included within semiconductor device 300, bottom surface 352 of the one or more backside connection VIAs 344 may be coplanar with the bottom most surface of such other backside 305 layers. Alternatively, if additional backside 305 layers are not fabricated and not included within semiconductor device 300, bottom surface 352 of the one or more backside connection VIAs 344 may be coplanar with the bottom surface 143 of lower dielectric layer 364 and/or bottom surface 352 may be coplanar generally with backside 305 of substrate 302.

Figure 14:
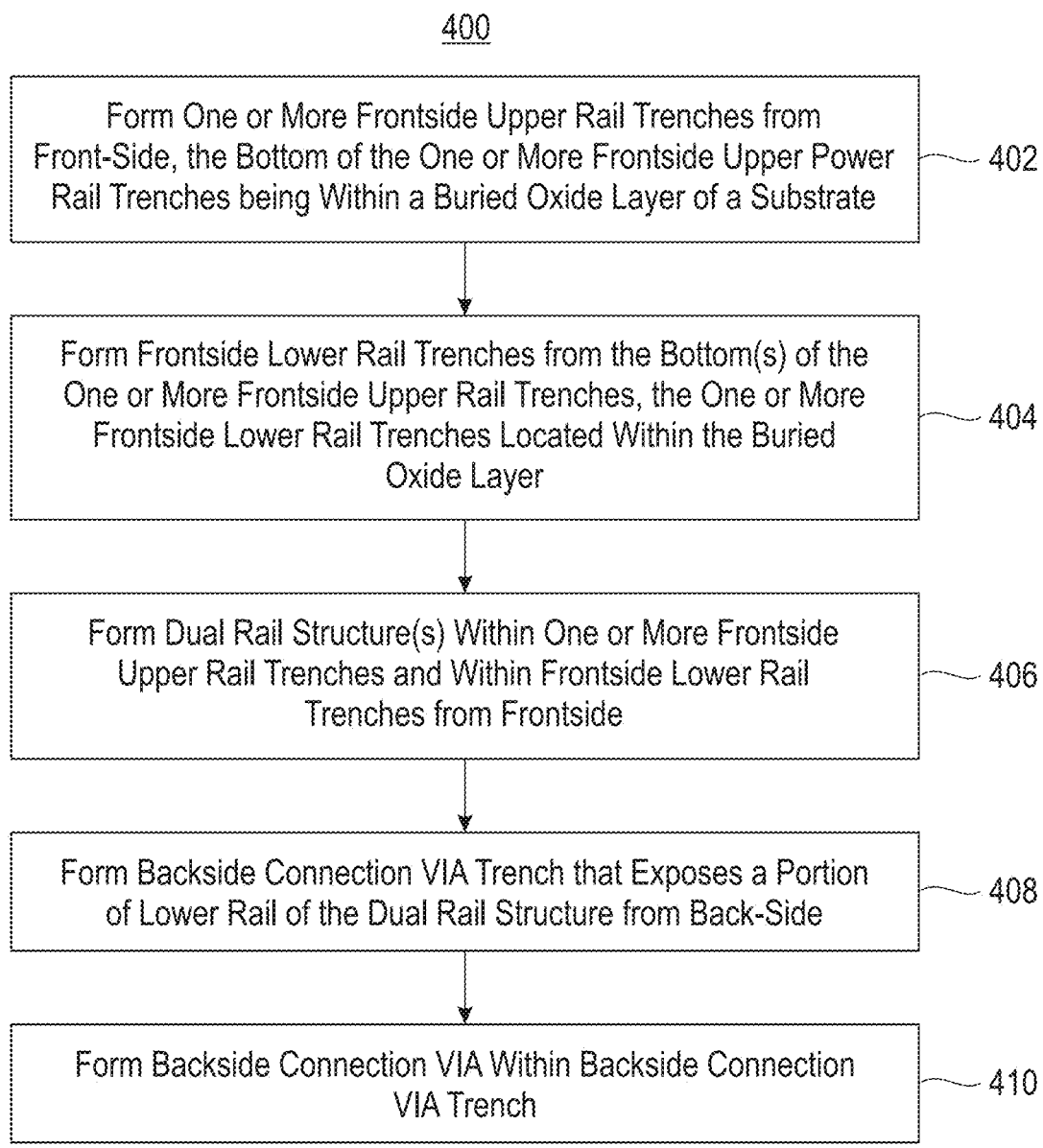
FIG. 14 depicts a method of fabricating a semiconductor device that includes a dual structure buried rail, in accordance with embodiments of the present disclosure.

FIG. 14 depicts a method 400 of fabricating semiconductor device 300 that includes dual structure buried rail 304, in accordance with embodiments of the present disclosure. Method 400 may include forming one or more buried rail trenches 306' (block 402) and may correspond with the fabrication stage and semiconductor device 300 structures depicted in FIG. 10. Method 400 may further include forming one or more buried rail trenches 308' (block 404) and may correspond with the fabrication stage and semiconductor device 300 structures depicted in FIG. 11.

Method 400 may include forming a dual structure rail 304 within the associated buried rail trench 306' and buried rail trench 308' (block 406) and may correspond with the fabrication stage and semiconductor device 300 structures depicted in FIG. 12.

Method 400 may include forming one or more backside connection VIA trenches 345 (block 408) and one or more backside connection VIAs 344 from backside 305 (block 410) and may correspond with the fabrication stage and semiconductor device 300 structure depicted in FIG. 13, respectively.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a pair of adjacent active device regions; and
    a dual structured buried rail comprising an upper rail and a lower rail, the upper rail in between the pair of adjacent active device regions and between upwardly tapering side surfaces of the lower rail, wherein the lower rail directly in contact with the upper rail and has a greater volume with respect to the upper rail, wherein the upper rail comprises downwardly tapering side surfaces such that a bottom surface of the upper rail is laterally narrower than a top surface of the upper rail, and wherein a top surface of the lower rail is laterally narrower than a bottom surface of the lower rail.

2. The semiconductor device of claim 1, wherein a first portion of the lower rail is vertically underneath a first active device region of the pair of adjacent active device regions.

3. The semiconductor device of claim 2, wherein a second portion of the lower rail is vertically underneath a second active device region of the pair of adjacent active device regions.

4. The semiconductor device of claim 3, wherein a top surface of the upper rail is below a top surface of each of the pair of adjacent active device regions.

5. The semiconductor device of claim 4, wherein a front end surface of the upper rail and a front end surface of the lower rail are coplanar and wherein a rear end surface of the upper rail and a rear end surface of the lower rail are coplanar.

6. The semiconductor device of claim 5, wherein the lower rail is directly in contact with the upper rail along an entire length between the coplanar front end surfaces of the upper rail the lower rail and the coplanar rear end surfaces of the upper rail and the lower rail.

7. The semiconductor device of claim 1, wherein the upper rail is a frontside buried rail and wherein the lower rail is a backside buried rail.

8. The semiconductor device of claim 1, further comprising:
    a backside vertical access interconnect (VIA) that is directly in contact with a bottom surface of the lower rail, wherein a top surface of the backside VIA is inset with respect to the bottom surface of the lower rail.

9. The semiconductor device of claim 8, wherein the backside VIA comprises upwardly tapering side surfaces.

10. A semiconductor device comprising:
    a pair of adjacent active device regions; and
    a dual structured buried rail comprising an upper rail and a lower rail, the upper rail in between the pair of adjacent active device regions and inset with respect to the lower rail, the lower rail comprising a curved lower surface and a horizontal upper surface that is in directly contact with the upper rail, the lower rail further comprising a greater volume with respect to the upper rail.

11. The semiconductor device of claim 10, wherein a first portion of the lower rail is vertically underneath a first active device region of the pair of adjacent active device regions.

12. The semiconductor device of claim 11, wherein a second portion of the lower rail is vertically underneath a second active device region of the pair of adjacent active device regions.

13. The semiconductor device of claim 12, wherein a top surface of the upper rail is below a top surface of each of the pair of adjacent active device regions.

14. The semiconductor device of claim 13, wherein a front end surface of the upper rail and a front end surface of the lower rail are coplanar and wherein a rear end surface of the upper rail and a rear end surface of the lower rail are coplanar.

15. The semiconductor device of claim 14, wherein the lower rail is directly in contact with the upper rail along an entire length between the coplanar front end surfaces and the coplanar rear end surfaces.

16. The semiconductor device of claim 10, wherein the upper rail comprises downwardly tapering side surfaces.

17. The semiconductor device of claim 10, further comprising:

a backside vertical access interconnect (VIA) that is directly in contact with the curved lower surface of the lower rail, wherein a top surface of the backside VIA is inset with respect to the lower rail.

18. The semiconductor device of claim 17, wherein the backside VIA comprises upwardly tapering side surfaces.

19. A semiconductor device comprising:

a dual structured buried rail comprising an upper rail and a lower rail that is directly in contact with the upper rail;

wherein the upper rail comprises downwardly tapering side surfaces such that a bottom surface of the upper rail is horizontally narrower than a top surface of upper rail and wherein the lower rail comprises upwardly tapering side surfaces such that the top surface of lower rail is horizontally narrower than a bottom surface of lower rail;

wherein a front surface of the upper rail and a front surface of the lower rail are coplanar and wherein a rear surface of the upper rail and a rear surface of the lower rail are coplanar.

20. The semiconductor device of claim 19, wherein the upper rail is a frontside buried rail and the lower rail is a backside buried rail.

* * * * *